United States Patent
Lee et al.

(10) Patent No.: US 9,166,062 B2
(45) Date of Patent: Oct. 20, 2015

(54) FIELD EFFECT TRANSISTOR USING GRAPHENE

(71) Applicant: Samsung Electronics Co., Ltd., Suwon-si, Gyeonggi-do (KR)

(72) Inventors: Jae-ho Lee, Seoul (KR); Seong-jun Park, Seoul (KR); Kyung-eun Byun, Uijeongbu-si (KR); David Seo, Yongin-si (KR); Hyun-jae Song, Hwaseong-si (KR); Hyung-cheol Shin, Seoul (KR); Jae-hong Lee, Seoul (KR); Hyun-jong Chung, Hwaseong-si (KR); Jin-seong Heo, Suwon-si (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 14/693,680

(22) Filed: Apr. 22, 2015

(65) Prior Publication Data
US 2015/0228804 A1    Aug. 13, 2015

Related U.S. Application Data

(62) Division of application No. 13/772,693, filed on Feb. 21, 2013, now Pat. No. 9,040,957.

(30) Foreign Application Priority Data

Jul. 16, 2012 (KR) .......................... 10-2012-0077368

(51) Int. Cl.
*H01L 21/36* (2006.01)
*H01L 29/786* (2006.01)

(Continued)

(52) U.S. Cl.
CPC ...... *H01L 29/78696* (2013.01); *H01L 29/1606* (2013.01); *H01L 29/66045* (2013.01)

(58) Field of Classification Search
CPC ................... H01L 29/1606; H01L 29/66742; H01L 29/78684; H01L 29/778; H01L 29/78; H01L 21/02527; H01L 29/66045; H01L 51/0036; H01L 51/0045; H01L 51/0558; H01L 51/4253; H01L 29/66431; H01L 29/78603
USPC ........ 438/197, 478, 489, 490; 257/9, 29, 253, 257/E21.09
See application file for complete search history.

(56) References Cited

U.S. PATENT DOCUMENTS

| 6,869,581 | B2 | 3/2005 | Kishi et al. |
| 7,736,741 | B2 | 6/2010 | Maruyama et al. |

(Continued)

FOREIGN PATENT DOCUMENTS

| KR | 2009-0009049 A | 1/2009 |
| KR | 20090065206 A | 6/2009 |

(Continued)

OTHER PUBLICATIONS

Office Action for corresponding U.S. Appl. No. 13/772,693, dated Aug. 6, 2014.

(Continued)

*Primary Examiner* — Mark A Laurenzi
(74) *Attorney, Agent, or Firm* — Harness, Dickey & Pierce, P.L.C.

(57) ABSTRACT

According to example embodiments, a field effect transistor includes a graphene channel layer on a substrate. The graphene channel layer defines a slit. A source electrode and a drain electrode are spaced apart from each other and arranged to apply voltages to the graphene channel layer. A gate insulation layer is between the graphene channel layer and a gate electrode.

4 Claims, 10 Drawing Sheets

(51) Int. Cl.
*H01L 29/16* (2006.01)
*H01L 29/66* (2006.01)

(56) References Cited

U.S. PATENT DOCUMENTS

| | | |
|---|---|---|
| 2003/0098640 A1 | 5/2003 | Kishi et al. |
| 2009/0020399 A1 | 1/2009 | Kim et al. |
| 2009/0174435 A1 | 7/2009 | Stan et al. |
| 2010/0127243 A1 | 5/2010 | Banerjee et al. |
| 2010/0127312 A1 | 5/2010 | Grebel et al. |
| 2010/0258787 A1 | 10/2010 | Chae et al. |
| 2010/0327847 A1 | 12/2010 | Leiber et al. |
| 2011/0220865 A1 | 9/2011 | Miyata et al. |
| 2011/0244661 A1 | 10/2011 | Dai et al. |
| 2012/0112250 A1 | 5/2012 | Chung et al. |
| 2012/0132893 A1 | 5/2012 | Heo et al. |
| 2012/0168722 A1 | 7/2012 | Chung et al. |
| 2012/0248414 A1 | 10/2012 | Kim et al. |
| 2014/0014905 A1 | 1/2014 | LEE et al. |

FOREIGN PATENT DOCUMENTS

| | | |
|---|---|---|
| KR | 20090129298 A | 12/2009 |
| KR | 2010-0016928 A | 2/2010 |
| KR | 20100016929 A | 2/2010 |
| KR | 20100111999 A | 10/2010 |
| KR | 2010-0121731 A | 11/2010 |
| KR | 2011-0081683 A | 7/2011 |
| KR | 2012-0015290 A | 2/2012 |
| KR | 2012-0048241 A | 5/2012 |
| KR | 2012-0076061 A | 7/2012 |
| KR | 2013-0022854 A | 3/2013 |

OTHER PUBLICATIONS

K. Novoselov et al. "Electric Field Effect in Atomically Thin Carbon Films"; Science, vol. 306, p. 666-669; Oct. 22, 2004.

Melinda Y. Han et al., "Electron transport in Disordered Graphene Nanoribbons," Phys. Rev. Ltrs., The Am. Phys. Soc., vol. 104, 056801-1-056801-4 (Feb. 5, 2010).

Jingwei Bai et al., "Graphene nanomesh," Nature Nanotechnology, vol. 5, pp. 190-194 (Mar. 2010).

Thomas G. Pedersen et al., "Graphene Antidot Lattices- Designed Defects and Spin Qubits" arXiv:0802.4019v1, Feb. 27, 2008, whole document.

Liang et al., "Formation of Bandgap and Subbands in Graphene Nanomeshes with Sub-10 nm Ribbon Width Fabricated via Nanoimprint Lithography", Nano Letters 10 (2010) pp. 2454-2460.

Bai et al., "Graphene nanomesh", Nature Nanotechnology 5 (2010) pp. 190-194.

Office Action for corresponding U.S. Appl. No. 13/242,177 dated Mar. 25, 2013.

Final Office Action for corresponding U.S. Appl. No. 13/242,177 dated Jul. 5, 2013.

Office Action for corresponding U.S. Appl. No. 13/242,177 dated Jul. 31, 2013.

FIELD EFFECT TRANSISTOR USING GRAPHENE

CROSS-REFERENCE TO RELATED APPLICATIONS

This U.S. non-provisional patent application is a divisional of U.S. patent application Ser. No. 13/772,693 filed on Feb. 21, 2013 and claims priority under 35 U.S.C. §119 to Korean Patent Application No. 10-2012-0077368, filed on Jul. 16, 2012, in the Korean Intellectual Property Office, the disclosure of which is incorporated herein in its entirety by reference.

BACKGROUND

1. Field

Example embodiments relate to field effect transistors including graphene, and more particularly, to field effect transistors including graphene as channel layers.

2. Description of the Related Art

Currently, carbon-based materials including fullerene, carbon nanotube, diamond, graphite, and graphene are being researched in various fields.

From among those materials, carbon nanotube has been in the limelight since the 1990s. However, recently, some attention has been focused on graphene. Graphene may have a plate-like structure. Graphene is a thin-film in which carbon atoms are 2-dimensionally arranged. Since charges in graphene may function as zero effective mass particles, graphene may have very high electric conductivity, high heat conductivity, and high elasticity.

Various research has characterized some properties of graphene and/or studied applications of graphene to various fields. Particularly, Novoselov and Geim have fabricated graphene having a hexagonal structure, in which carbon atoms are 2-dimensionally arranged, by mechanically peeling off graphene, fabricated a transistor using the same, and have reported field effect property of graphene. In other words, a transistor using graphene features linear increase of conductivity according to gate voltages.

SUMMARY

Example embodiments relate to high-performance field effect transistors which include graphene as channel layers and are capable of having a high ON/OFF ratio of operation currents.

Additional aspects will be apparent in the description which follows and, or may be learned by practice of example embodiments.

According to example embodiments, a field effect transistor includes: a substrate; a graphene channel layer on the substrate, the graphene channel layer defining a slit; a source electrode and a drain electrode spaced apart from each other, the source electrode and the drain electrode being configured to apply voltages to the graphene channel layer; a gate electrode on the graphene channel layer; and a gate insulation layer between the graphene channel layer and the gate electrode.

In example embodiments, a potential barrier material may fill the slit. The potential barrier material may be configured to induce Fowler-Nordheim (F-N) tunneling through the graphene channel layer when a gate voltage is applied to the gate electrode.

In example embodiments, the potential barrier material may include undoped silicon (Si).

In example embodiments, the potential barrier material and the gate insulation layer may be a same material.

In example embodiments, a width of the slit may allow F-N tunneling through the graphene channel layer when a gate voltage is applied to the gate electrode.

In example embodiments, the graphene channel layer may define a plurality of the slits.

In example embodiments, the gate electrode may be closer to the slit than at least one of the source electrode and the drain electrode.

In example embodiments, the source electrode may be closer to the slit than the drain electrode.

According to example embodiments, a field effect transistor includes: a substrate; a graphene channel layer on the substrate, the graphene channel layer defining a slit; a source electrode and a drain electrode spaced apart from each other, the source electrode and the drain electrode being configured to apply voltages to the graphene channel layer; a gate electrode on the graphene channel layer; and a gate insulation layer between the graphene channel layer and the gate electrode, wherein the slit is filled with a potential barrier material that is configured to induce Fowler-Nordheim (F-N) tunneling through the graphene channel layer when a gate voltage is applied to the gate electrode.

In example embodiments, the potential barrier material may be undoped silicon (Si).

According to example embodiments, a field effect transistor includes: a substrate; a graphene channel layer, on the substrate, the graphene channel layer defining a slit; a source electrode and a drain electrode on opposite ends of the graphene channel layer; a gate electrode below the graphene channel layer; a gate insulation layer between the graphene channel layer and the gate electrode; and a potential barrier material filling the slit of the graphene channel layer, the potential battier material being configured to induce Fowler-Nordheim (F-N) tunneling through the graphene channel layer when a gate voltage is applied to the gate electrode.

In example embodiments, the potential barrier material may be undoped silicon (Si).

According to example embodiments, a method of fabricating a field effect transistor includes: forming a graphene channel layer on a substrate; forming a slit in the graphene channel layer; forming a source electrode and a drain electrode that are spaced apart from each other, the source and the drain electrode being configured to apply voltages to the graphene channel layer; forming a gate electrode on the graphene channel layer; forming a gate insulation layer between the graphene channel layer and the gate electrode; and filling the slit with a potential barrier material, the potential barrier material being configured to induce Fowler-Nordheim (F-N) tunneling through the graphene channel layer when a gate voltage is applied to the gate electrode.

In example embodiments, the forming the slit may include using an e-beam lithography method.

In example embodiments, the potential barrier material and the gate insulation layer may be formed of a same material.

In example embodiments, the potential barrier material may be undoped silicon (Si).

According to example embodiments, a field effect transistor includes: a substrate, a graphene channel layer on the substrate, the graphene channel layer defining at least one slit; a source electrode and a drain electrode that are spaced apart on at least one of the graphene layer and the substrate; a gate electrode on the substrate; a gate insulation layer between the gate electrode and the graphene channel layer.

In example embodiments, the graphene channel layer may define one slit, a potential barrier material may fill the slit of the graphene channel layer, and the potential barrier material may be configured to induce Fowler-Nordheim (F-N) tunneling through the graphene channel layer when a gate voltage is applied to the gate electrode.

In example embodiments, the potential barrier material and the gate insulation layer may be a same material.

In example embodiments, the graphene channel layer may define one slit, the slit of the graphene channel layer may be closer to one of the source electrode and the drain electrode compared to an other of the source electrode and the drain electrode.

In example embodiments, the graphene channel layer may be about one to about three carbon layers in thickness.

In example embodiments, the gate electrode may be between the source electrode and the drain electrode.

BRIEF DESCRIPTION OF THE DRAWINGS

These and/or other aspects will become apparent and more readily appreciated from the following description of non-limiting embodiments, taken in conjunction with the accompanying drawings. The drawings are not necessarily to scale, emphasis instead being placed upon illustrating principles of example embodiments. In the drawings.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
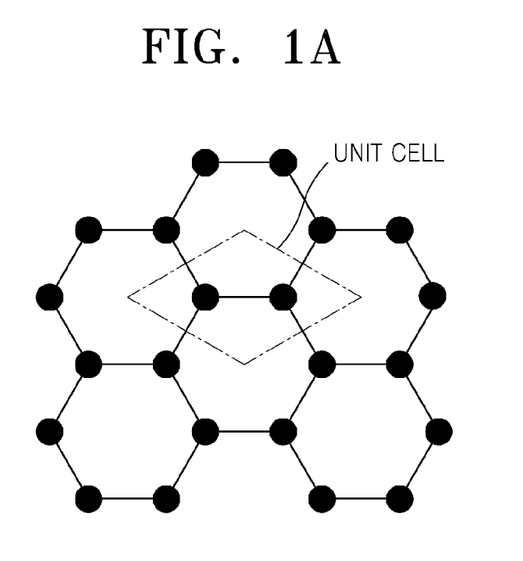
FIGS. 1A and 1B are schematic diagrams respectively showing carbon atom arrangement of graphene and energy band structure of graphene nearby the Fermi energy.
Figure 1B:
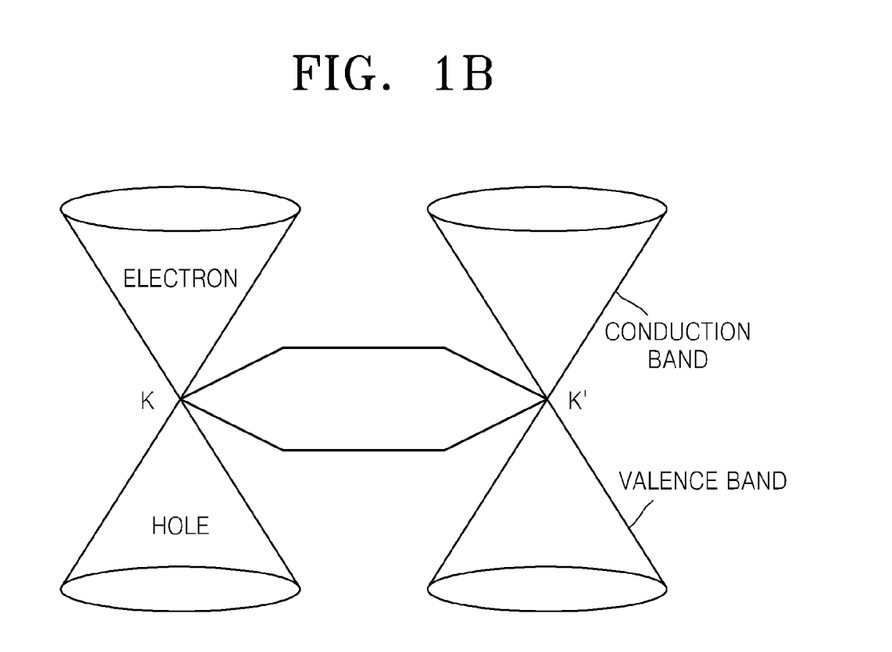

FIGS. 1A and 1B are schematic diagrams respectively showing carbon atom arrangement of graphene and energy band structure of graphene nearby the Fermi energy.

Referring to FIG. 1A, graphene has a honeycomb-like structure in which carbon atoms are located at vertexes of a hexagon. FIG. 1B shows an energy band structure regarding a unit cell including two carbon atoms adjacent to each other.

Referring to FIG. 1B, in the energy band structure of graphene, a conduction band and a valance band meet each other at each of valleys of Brillouin zone having a hexagonal structure in k space, and the energy band structure of graphene has a conic shape nearby the Fermi energy. Energy of charges is proportional to momentum, which is similar to dispersion relation of photons having no mass. In other words, effective mass of electrons in graphene may become zero, and carrier mobility in graphene may be very fast (in Fermi speed about 1/300 of speed of light). The carrier mobility in graphene may be very high, for example from about 20,000 $cm^2/Vs$ to about 200,000 $cm^2/Vs$. Therefore, graphene may be applied to field effect transistors and high-speed switching devices.

Meanwhile, graphene may have a zero band gap type energy band. Therefore, if graphene is used as a channel of a field effect transistor, high current may flow even in OFF state where no voltage is applied to a gate, and thus an ON/OFF ratio of an operation current may be very low. To fabricate a high-performance transistor, it is desirable to raise an ON/OFF ratio of an operation current.

Figure 2:
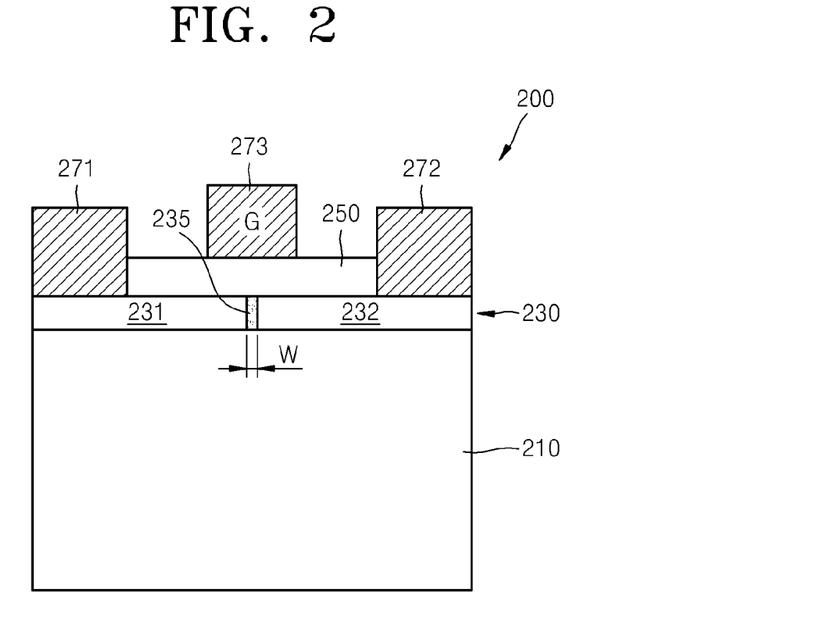
FIG. 2 is a sectional view of a field effect transistor including a graphene channel layer, according to example embodiments.

FIG. 2 is a sectional view of a field effect transistor 200 including a graphene channel layer, according to example embodiments.

Referring to FIG. 2, the field effect transistor 200 includes a substrate 210, a graphene channel layer 230 that is arranged on the substrate 210 and includes a slit 235, a source electrode 271 and a drain electrodes 272 that are arranged to apply voltages to the graphene channel layer 230 and are apart from each other, a gate electrode 273 that is arranged to form an electric field on the graphene channel layer 230, and a gate insulation layer 250 that is arranged between the graphene channel layer 230 and the gate electrode 273.

The substrate 210 may be formed of any of various materials on which graphene may be formed. For example, the substrate 210 may be formed of any of silicon (Si), silicon-germanium (SiGe), silicon carbide (SiC), glass, plastics, etc. Furthermore, the substrate 210 may include an epitaxial layer, a silicon-on-insulator (SOI) layer, a semiconductor-on-insulator (SEOI) layer, etc. However, example embodiments are not limited thereto.

The graphene channel layer 230 may be a single- or multi-layered structure of about one to about three carbon atoms in thickness, but example embodiments are not limited thereto.

The graphene channel layer 230 may contain graphene having the structure and the energy band as respectively shown in FIGS. 1A and 1B. The graphene channel layer 230 may be formed using a micro-mechanical method, thermal decomposition of SiC crystals, chemical vapor deposition (CVD), etc.

The micro-mechanical method is a method of obtaining graphene by attaching an adhesive tape to a graphite sample, detaching the adhesive tape from the graphite sample, and collecting graphene peeled off the graphite.

The principle of the thermal decomposition of SiC crystals is that, when a SiC monocrystal is heated, SiC on surfaces of the SiC crystal is decomposed, and Si is removed and graphene is formed of the remaining carbon (C).

Synthesis of graphene using CVD is described below.

First, a silicon wafer having a silicon oxide ($SiO_2$) layer is prepared. Next, a metal catalyst layer is formed by depositing a metal catalyst, such as nickel (Ni), copper (Cu), aluminum (Al), iron (Fe), etc., onto the $SiO_2$ layer by using a sputtering device or an e-beam evaporator.

Next, the silicon wafer having formed thereon the metal catalyst layer and a carbon-containing gas ($CH_4$, $C_2H_2$, $C_2H_4$, CO, etc.) are supplied into a reactor for thermo-chemical vapor deposition or inductive coupled plasma chemical vapor deposition (ICP-CVD) and are heated, such that carbon is absorbed to the metal catalyst layer. Next, graphene is synthesized by separating carbon from the metal catalyst layer by rapidly cooling the silicon wafer including the metal catalyst layer and crystallizing the separated carbon.

Methods for forming the graphene channel layer 230 are not limited to the methods of synthesizing graphene as described above, and the graphene channel layer 230 may be formed of any of various methods. Furthermore, the graphene channel layer 230 may be formed by synthesizing graphene and transferring the graphene to another substrate or a film.

Referring back to FIG. 2, the graphene channel layer 230 includes a first area 231, a second area 232, and the slit 235. The slit 235 may be formed by using e-beam lithography method. In other words, photoresist (PR) is applied onto the graphene channel layer 230, the photoresist is exposed by using a mask having formed thereon a slit pattern, and the PR is selectively etched. Next, the slit 235 may be patterned by using an e-beam equipment. However, a method of forming the slit 235 is not limited thereto, and the slit 235 may be formed by using any of various methods.

The slit 235 may be filled with a potential barrier material, such that Fowler-Nordheim (F-N) tunneling of electrons may occur between the first area 231 and the second area 232 when a gate voltage is applied. The F-N tunneling effect will be described later. The potential barrier material may be a material of which Fermi potential is similar to that of graphene when gate voltage is applied. More particularly, the potential barrier material may include a semiconductor such as Si, germanium (Ge), SiC, aluminum nitride (AlN), gallium nitride (GaN), gallium phosphide (GaP), GaAs, CdS, ZnSe, CdTe, etc.

The potential barrier material filling the slit 235 may be formed by using a deposition method, such as epitaxial growth, CVD, plasma-enhanced CVD (PECVD), low pressure CVD, physical vapor deposition (PVD), sputtering, atomic layer deposition (ALD), etc. The potential barrier material may fill the slit 235 and may be additionally formed on the graphene channel layer 230. The potential barrier material formed on the graphene channel layer 230 may be removed if necessary.

Furthermore, a width w of the slit 235 may be a width for inducing F-N tunneling of electrons between the first area 231 and the second area 232 when a voltage is applied to the gate electrode 273, e.g., from several nm to dozens of nm.

Figure 5A:
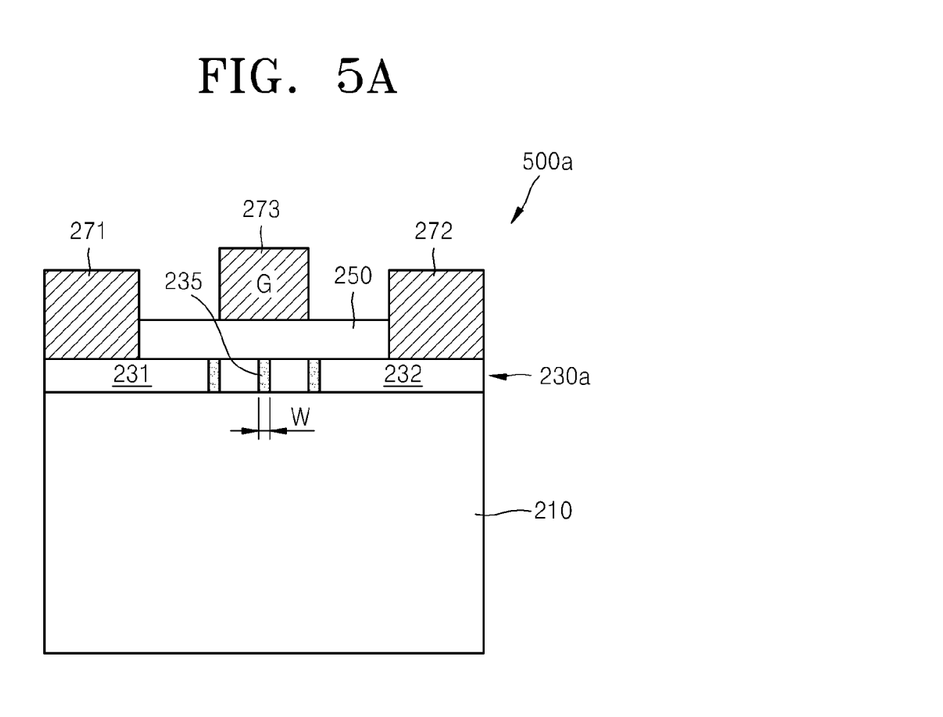
FIGS. 5A, 5B, and 5C are sectional views of field effect transistors including a graphene channel layer, according to example embodiments.
Figure 5B:
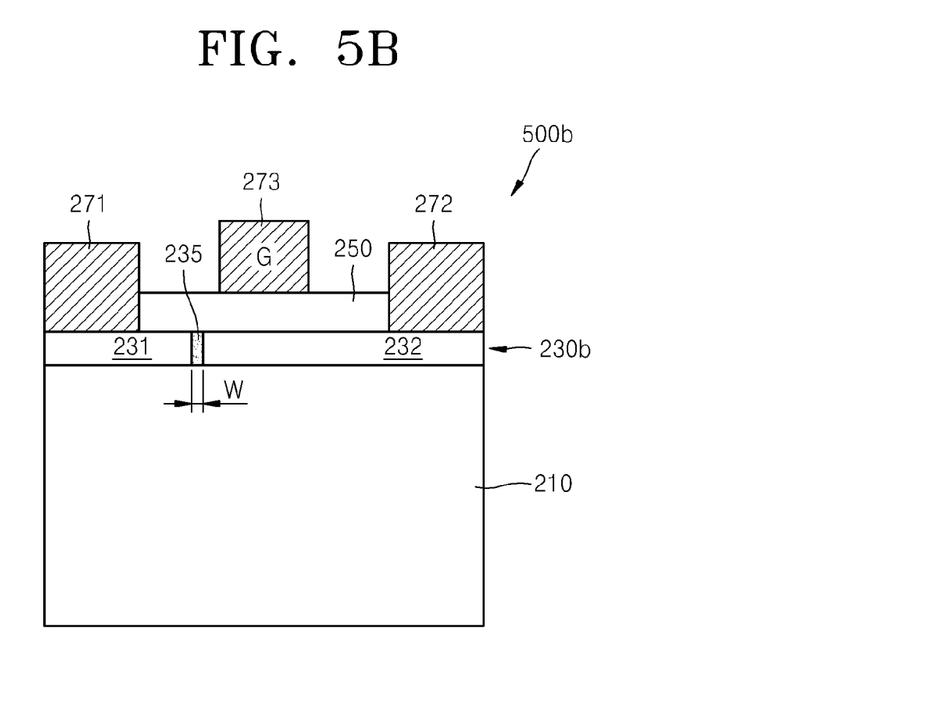
Figure 5C:
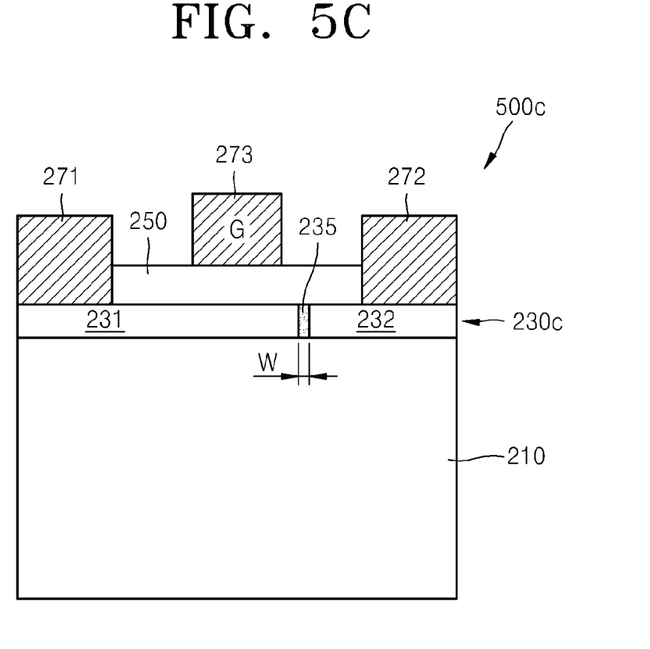

The slit 235 may be formed at the center of the graphene channel layer 230. Alternatively, as shown in FIG. 5B, a field effect transistor 500b according to example embodiments may be the same as the field effect transistor 200 in FIG. 2, except the slit 235 of the graphene channel layer 230b may be formed at a location that is closer to the source electrode 271 than the drain electrode 272. Alternatively, as shown in FIG. 5C, a field effect transistor 500c according to example embodiments may be the same as the field effect transistor 200 in FIG. 2, except the slit 235 of the graphene channel layer 230c may be formed at a location that is closer to the drain electrode 272 than the source electrode 271. Furthermore, as shown in FIG. 5A, a field effect transistor 500a according to example embodiments may be the same as the field effect transistor 200 in FIG. 2, except the graphene channel layer 230 may include a plurality of slits 235. In this case, materials filling the slits 235 and widths w of the slits 235 may vary from one another.

The source electrode 271 and the drain electrode 272 may be electrically connected to each other via the graphene channel layer 230. The source electrode 271 and the drain electrode 272 may contain a conductive material. For example, the source electrode 271 and the drain electrode 272 may be formed of a metal, a metal alloy, a conductive metal oxide, or a conductive metal nitride. More particularly, the source electrode 271 and the drain electrode 272 may contain at least one from among aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The source electrode 271 and the drain electrode 272 may have a single layer structure or a multi-layer structure. The source electrode 271 and the drain electrode 272 may be formed by using a deposition method, such as CVD, PECVD, low pressure CVD, (PVD), sputtering, ALD, etc. The source electrode 271 and the drain electrode 272 may be replaced with each other.

The gate electrode 273 may contain a conductive material and may be formed of a metal, a metal alloy, a conductive metal oxide, or a conductive metal nitride, and combinations thereof. The metal may include at least one from among Al, Au, Be, Bi, Co, Cu, Hf, In, Mn, Mo, Ni, Pb, Pd, Pt, Rh, Re, Ru, Ta, Te, Ti, W, Zn, and Zr. Furthermore, the gate electrode 273 may be formed of a semiconductor material doped with an impurity. The gate electrode 273 may be formed by using a deposition method, such as CVD, PECVD, low pressure CVD, (PVD), sputtering, ALD, etc.

The gate insulation layer 250 is formed between the gate electrode 273 and the graphene channel layer 230. The gate insulation layer 250 may contain an insulation material, e.g., silicon, a silicon oxide, a silicon nitride, or a silicon oxynitride. Furthermore, the gate insulation layer 250 may be a composite layer having a double-layer structure including a silicon oxide layer and a silicon nitride layer or may be a partially nitrified silicon oxide layer. The nitrification may be performed by using any of methods, such as annealing, rapid thermal annealing, or laser RTA, by using a gas containing nitrogen, e.g., $NH_3$ gas. Furthermore, the nitrification may be performed by using any of other methods, such as plasma nitrification, plasma ion implantation, plasma enhanced CVD (PECVD), high-density plasma CVD (HDP-CVD), and radical nitrification. After the nitrification, the structure may be thermally treated in inert atmosphere containing an inert gas, such as helium or argon. A surface of the nitrified structure may face the gate electrode 273. Furthermore, the gate insulation layer 250 may be formed of the same material as the material filling the slit 235.

Figure 3A:
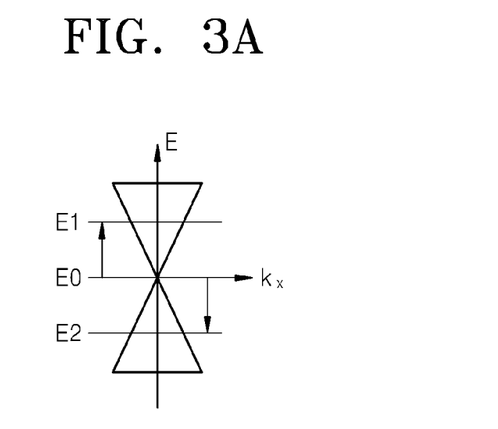
FIGS. 3A through 3D are energy band diagrams for describing an operation mechanism of the field effect transistor of FIG. 2.
Figure 3B:
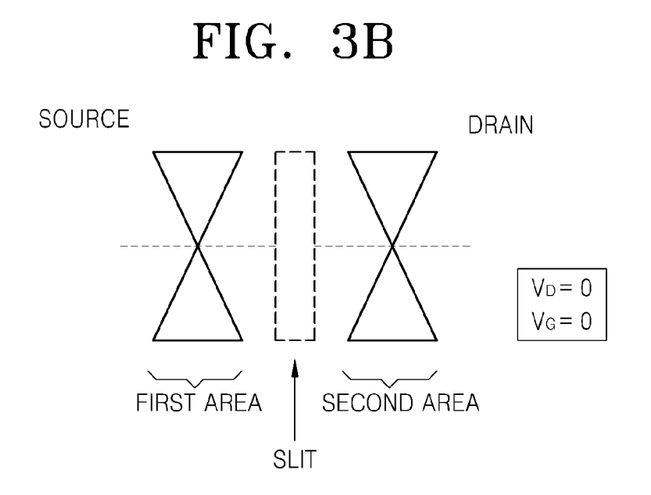
Figure 3C:
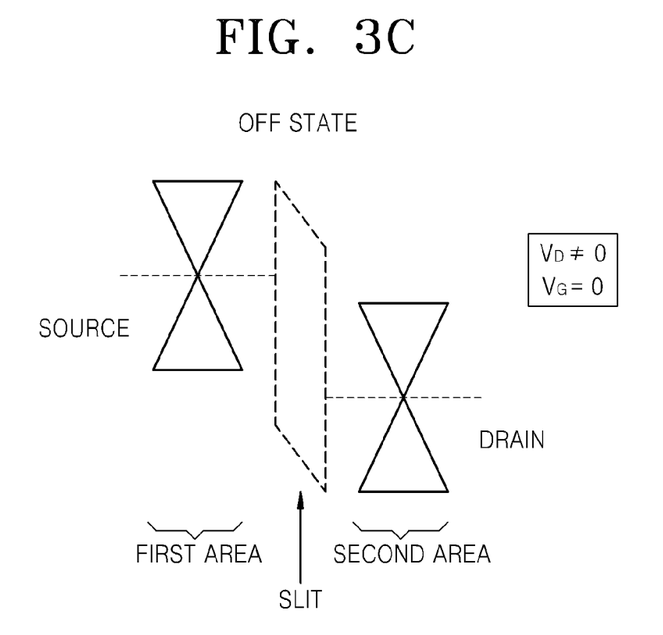

FIGS. 3A through 3C are energy band diagrams for describing operation mechanism of the field effect transistor 200 of FIG. 2.

FIG. 3A shows energy change in the graphene channel layer 230 when a gate voltage is applied to the field effect transistor 200. Referring to FIG. 3A, when a positive (+) gate voltage is applied to the gate electrode 273, the Fermi potential of the graphene channel layer 230 rises toward the conduction band from E0 to E1, and thus a number of conduction electrons increases. On the contrary, when a negative (−) gate voltage is applied to the gate electrode 273, the Fermi potential of the graphene channel layer 230 decreases toward the valence band from E0 to E2, and thus a number of conduction holes increases. In other words, based on polarity of a voltage applied to the gate electrode 273, charges may be induced in the graphene channel layer 230 and the Fermi level of graphene may be shifted.

FIG. 3B shows energy level of graphene at the first area 231, the second area 232, and the slit 235 of the graphene channel layer 230 when no drain voltage and no gate voltage are applied to the field effect transistor 200 of FIG. 2. The initial Fermi potential of the graphene channel layer 230 is E0.

FIG. 3C shows energy level of graphene when drain voltage is applied to the field effect transistor 200 of FIG. 2 and no gate voltage is applied thereto, that is, energy level of graphene in OFF state. As the drain voltage is applied, the energy levels of the slit 235 and the second area 232 are tilted. However, due to potential barrier formed by the slit 235, electrons hardly move between the first area 231 and the second area 232.

Figure 3D:
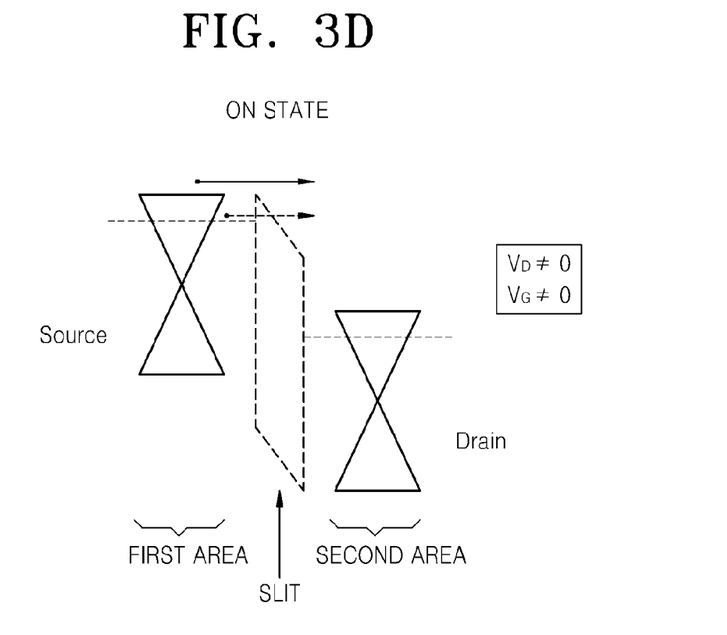

FIG. 3D shows energy level of graphene when drain voltage and gate voltage are applied to the field effect transistor 200 of FIG. 2, that is, energy level of graphene in ON state. As the gate voltage applied, the Fermi potential in graphene rises. If the Fermi potential in graphene is higher than the potential barrier formed by the slit 235, electrons in the graphene channel layer 230 may easily move from the first area 231 to the second area 232. The movement is indicated with a solid line. Furthermore, electrons in the first area 231, that is, electrons at the source side may tunnel through a triangular potential barrier. The tunneling is referred to as Fowler-Nordheim tunneling (F-N tunneling). Movement of electrons via the F-N tunneling is indicated with a broken line arrow. In case of the F-N tunneling, the width of tunneling barrier is narrow. Therefore, F-N tunneling may occur easier than direct tunneling. Here, the term direct tunneling refers to tunneling that occurs before a potential barrier is deformed by the slit 235.

The above description of operation of the field effect transistor 200 is given in relation to a case in which a positive gate voltage is applied. However, even if a negative gate voltage is applied, operation of the field effect transistor 200 may be same as described above except that holes function as carriers.

Figure 4:
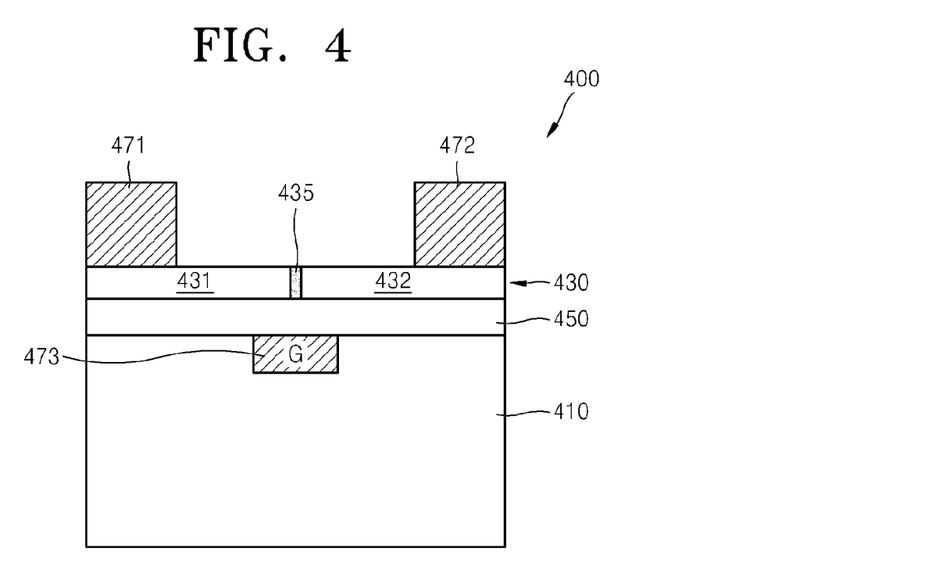
FIG. 4 is a sectional view of a field effect transistor including a graphene channel layer, according to example embodiments.

FIG. 4 is a sectional view of a field effect transistor 400 including a graphene channel layer 430, according to example embodiments.

Referring to FIG. 4, the field effect transistor 400 includes a substrate 410, a graphene channel layer 430 that is arranged on the substrate 410 and includes a slit 435, a source electrode 471 and a drain electrode 472 that are arranged to apply voltages to the graphene channel layer 430 and are apart from each other, agate electrode 473 that is arranged to form an electric field on the graphene channel layer 430, and a gate insulation layer 450 that is arranged between the graphene channel layer 430 and the gate electrode 473.

The field effect transistor 400 of FIG. 4 is identical to the field effect transistor 200 of FIG. 2 except that the gate electrode 473 and the gate insulation layer 450 are formed below the graphene channel layer 430.

The graphene channel layer 430 may be a single- or multi-layered structure of about one to about three carbon atoms in thickness, but example embodiments are not limited thereto.

The gate electrode 473 may contain a conductive material and may be formed of a metal, a metal alloy, a conductive metal oxide, or a conductive metal nitride, and combinations thereof. To form the gate electrode 473, a groove may be formed in the substrate 410, and the gate electrode 473 may be formed by using any of various thin-film deposition methods. Alternatively, after the gate electrode 473 is formed without forming a groove in the substrate 410, the gate insulation layer 450 may be formed to surround the gate electrode 473. Furthermore, to apply a voltage to the gate electrode 473, a via hole may be formed in the field effect transistor 400.

Figure 6A:
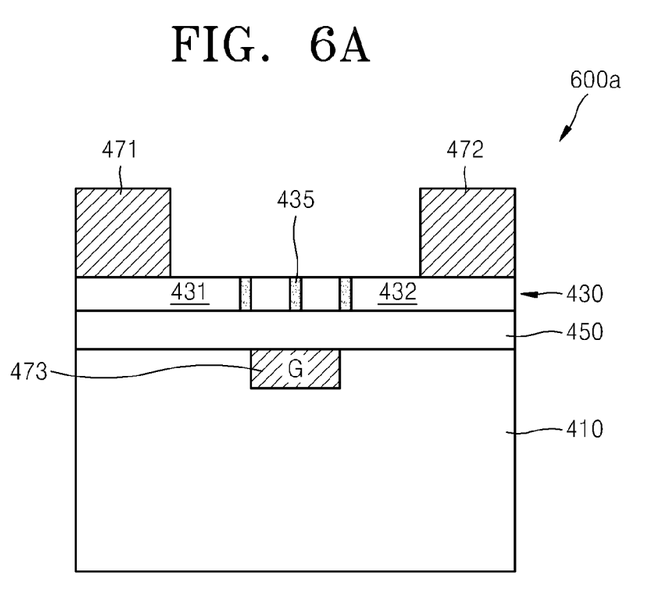
FIGS. 6A, 6B, and 6C are sectional views of field effect transistors including a graphene channel layer, according to example embodiments.
Figure 6B:
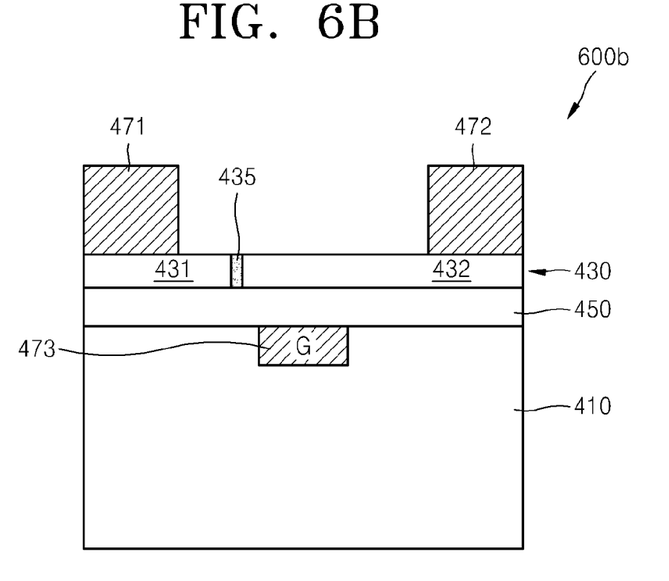
Figure 6C:
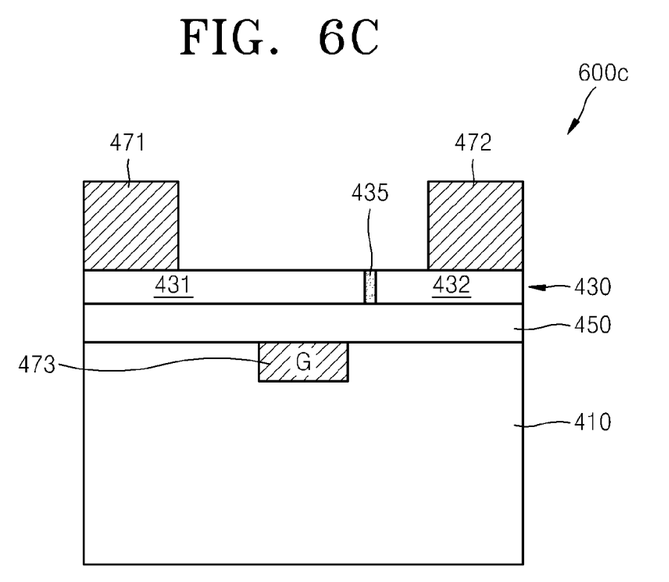

The slit 435 may be formed at the center of the graphene channel layer 430. Alternatively, as shown in FIG. 6B, a field effect transistor 600b according to example embodiments may be the same as the field effect transistor 400 in FIG. 4, except the slit 435 of the graphene channel layer 430b may be formed at a location that is closer to the source electrode 471 than the drain electrode 472. Alternatively, as shown in FIG. 6C, a field effect transistor 600c according to example embodiments may be the same as the field effect transistor 400 in FIG. 4, except the slit 435 of the graphene channel layer 430c may be formed at a location that is closer to the drain electrode 472 than the source electrode 471. Furthermore, as shown in FIG. 6A, a field effect transistor 600c according to example embodiments may be the same as the field effect transistor 400 in FIG. 2, except the graphene channel layer 430 may include a plurality, of slits 435. In this case, materials filling the slits 435 and widths w of the slits 435 may vary from one another.

FIGS. 7A to 7D are sectional views of field effect transistors including a graphene channel layer, according to example embodiments.

Figure 7A:
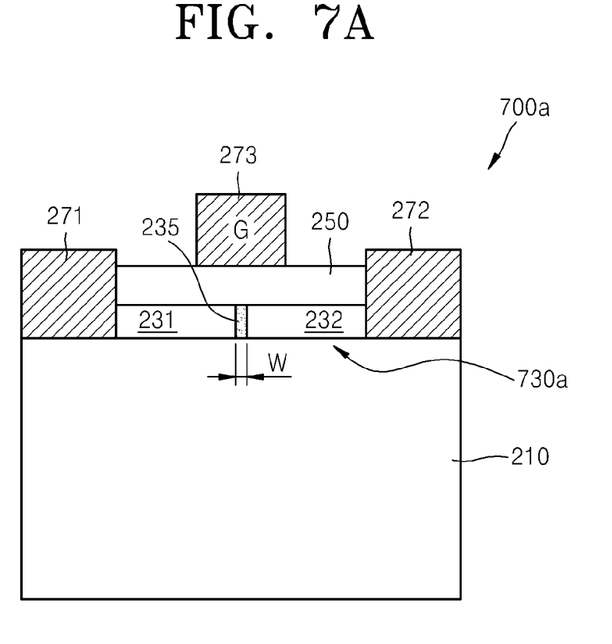
FIGS. 7A to 7D are sectional views of field effect transistors including a graphene channel layer, according to example embodiments.

Referring to FIG. 7A, according to example embodiments, a field effect transistor 700a may be the same as the field effect transistor 200 in FIG. 2, except for the arrangement of the source electrode 271 and/or the drain electrode 272. As shown in FIG. 7A, the source electrode 271 and the drain electrode 272 may be on the substrate 210 and contact sides of the graphene channel layer 730a.

Figure 7B:
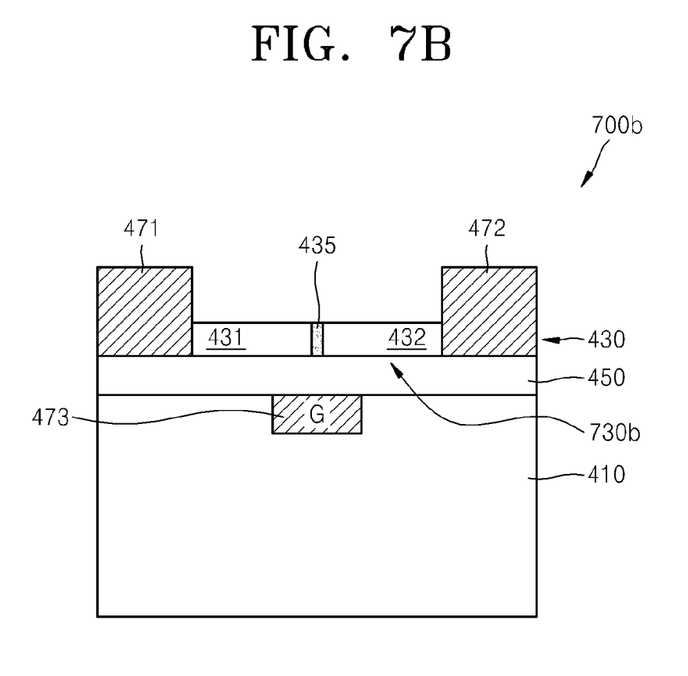

Referring to FIG. 7B, according to example embodiments, a field effect transistor 700b may be the same as the field effect transistor 400 in FIG. 4, except for the arrangement of the source electrode 471 and/or the drain electrode 472. As shown in FIG. 7B, the source electrode 471 and the drain electrode 472 may be on the gate insulation layer 450 and contact sides of the graphene channel layer 730b.

Figure 7C:
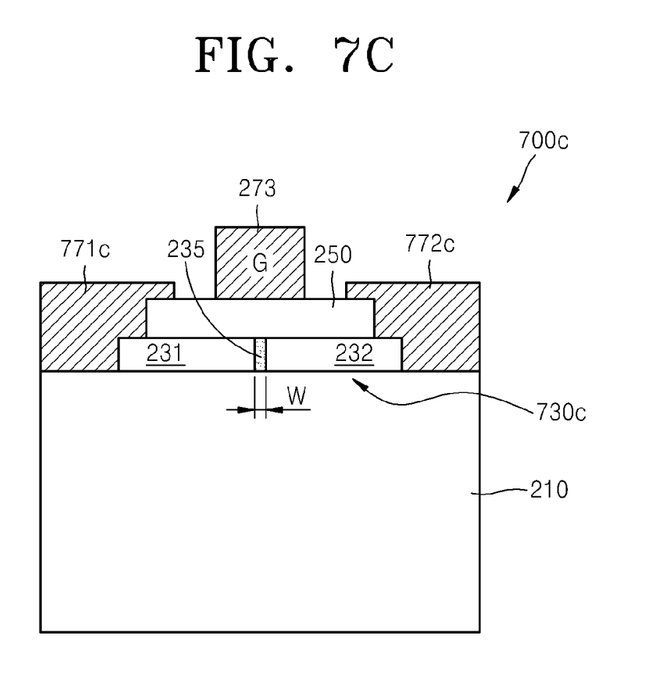

Referring to FIG. 7C, according to example embodiments, a field effect transistor 700c may be the same as the field effect transistor 200 in FIG. 2, except for the arrangement of the source electrode 771c and/or the drain electrode 772c. As shown in FIG. 7C, the source electrode 771c and the drain electrode 772c may be on the substrate 210 and the graphene channel layer 730c so the source electrode 771c and the drain electrode 772 contact sides of the graphene channel layer 730c.

Figure 7D:
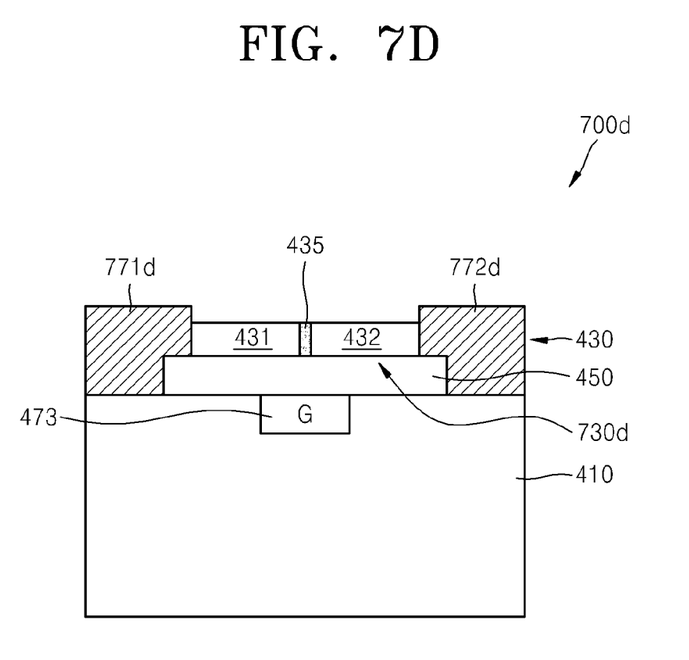

Referring to FIG. 7D, according to example embodiments, a field effect transistor 700d may be the same as the field effect transistor 400 in FIG. 4, except for the arrangement of the source electrode 771d and/or the drain electrode 772d. As shown in FIG. 7D, the source electrode 771d and the drain electrode 772d may be on the gate insulation layer 450 and the substrate 410 so the source electrode 771d and the drain electrode 772d contact sides of the graphene channel layer 730d.

While FIGS. 7A to 7D illustrate field effect transistors 700a to 700d, where the graphene channel layers 730a to 730d have a slit (235 or 435) in the middle of the graphene channel layers 730a to 730d, example embodiments are not limited thereto. For example, the graphene channel layers 730a to 730d of FIGS. 7A to 7D alternatively could be modified to include a graphene channel layer having a plurality of slits or a graphene channel layer have a slit that is closer to one of the source and drain electrodes, as shown in FIGS. 5A to 5C and FIGS. 6A to 6C.

Figure 8:
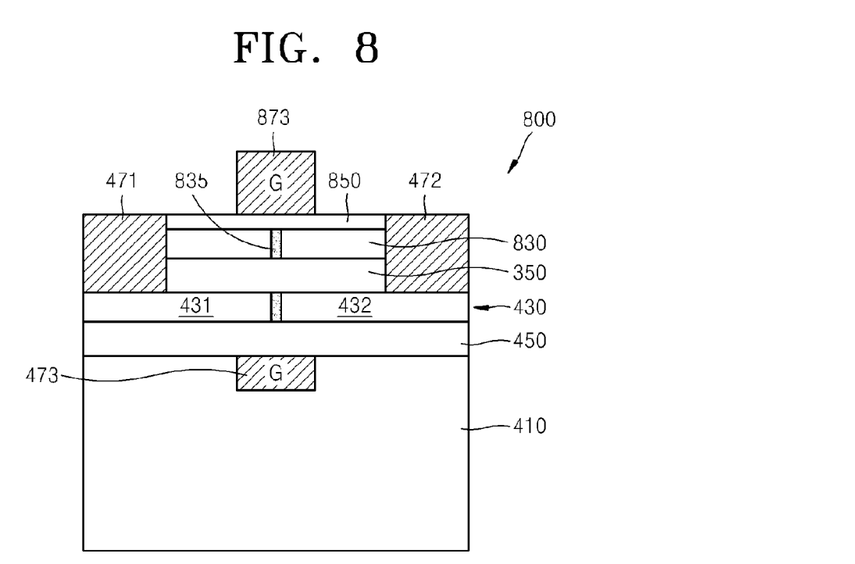
FIG. 8 is a sectional view of a field effect transistor including a plurality of graphene channel layers, according to example embodiments.

FIG. 8 is a sectional view of a field effect transistor including a plurality of graphene channel layers, according to example embodiments.

Referring to FIG. 8, according to example embodiments a field effect transistor 800 may be the same as the field effect transistor 400 in FIG. 4, except the field effect transistor 800 further includes an insulating layer 350 on the graphene channel layer 430, a second graphene channel layer 830 having a slit 835 on the insulating layer 350, a second gate insulating layer 850 on the second graphene channel layer 830, and a second gate electrode 873 on the second graphene channel layer 830. A material of the insulating layer 350 and second insulating layer 850 may be the same as a material of the gate insulating layer 450. A material of the gate electrode 873 may be the same as a material of the gate electrode 873.

While FIG. 8 illustrates a field effect transistor 800, where the graphene channel layers 830 and 430 have a slit (835 or 435) in the middle of the graphene channel layers 830 and 430, example embodiments are not limited thereto. For example, the graphene channel layers 830 and 430 of FIG. 8 alternatively could be modified to include a graphene channel layer having a plurality of slits or a graphene channel layer have a slit that is closer to one of the source and drain electrodes, as shown in FIGS. 5A to 5C and 6A to 6C.

Figure 9:
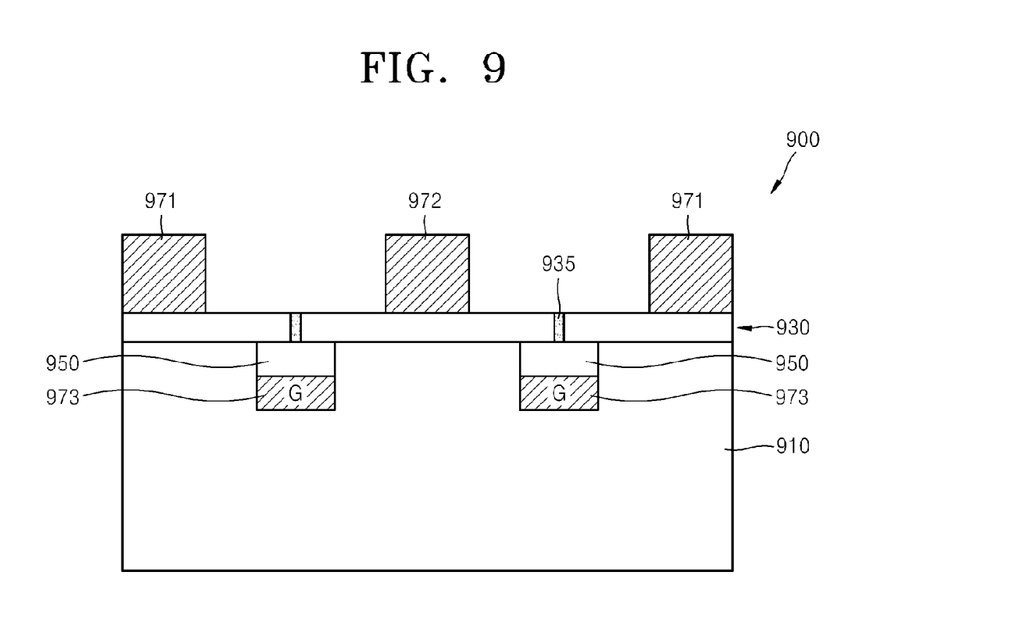
FIG. 9 is a sectional view of a field effect device according to example embodiments.

FIG. 9 is a sectional view of a field effect device according to example embodiments.

Referring to FIG. 9, according to example embodiments, a field effect system may include a substrate 910, a plurality of gate electrodes 973 positioned in grooves of the substrate 910, a plurality of gate insulating layers 950 on the gate electrodes 973, a graphene channel layer 930 on the substrate 910, and a plurality of first electrodes 971 and second electrodes 972 alternately spaced apart on the graphene channel layer 930. The graphene channel layer 930 may include a plurality of slits 935, similar to the slits 235 and 435 discussed above with reference to FIGS. 2 and 4.

As described above, since the field effect transistors 200 and 400 include slits that are filled with materials for forming potential barriers on the graphene channel layers 230 and 430, electrons may hardly move in OFF state. However, in ON state, the field effect transistors 200 and 400 operate according to material properties of graphene. As a result, ON/OFF ratios of operation currents of the field effect transistors 200 and 400 increase.

The field effect transistors 200, 400, 500a, 500b, 500c, 600a, 600b, 600c, 700a, 700b, 700c, 700d, and 800 described above are provided as examples of field effect transistors with improved quality due to the graphene channel layers including slits (e.g., 230, 430). However, detailed structures thereof may vary. For example, each thin-film layer may be formed to have a multi-layer structure instead of the single layer structure as shown herein.

It should be understood that example embodiments described herein should be considered in a descriptive sense only and not for purposes of limitation. Descriptions of features or aspects within each embodiment should typically be considered as available for other similar features or aspects in other embodiments. While some example embodiments have been particularly shown and described, it will be understood by one of ordinary skill in the art that variations in form and detail may be made therein without departing from the spirit and scope of the claims.

What is claimed is:

1. A method of fabricating a field effect transistor, the method comprising:
   forming a graphene channel layer on a substrate;
   forming a slit in the graphene channel layer;
   forming a source electrode and a drain electrode that are spaced apart from each other,
      the source and the drain electrode being configured to apply voltages to the graphene channel layer;
   forming a gate electrode on the graphene channel layer;
   forming a gate insulation layer between the graphene channel layer and the gate electrode; and
   filling the slit with a potential barrier material, the potential barrier material being configured to induce Fowler-Nordheim (F-N) tunneling through the graphene channel layer when a gate voltage is applied to the gate electrode.

2. The method of claim 1, wherein the forming the slit includes using e-beam lithography.

3. The method of claim 1, wherein the potential barrier material and the gate insulation layer are a same material.

4. The method of claim 1, wherein the potential barrier material includes undoped silicon (Si).

* * * * *